(12) United States Patent
Li et al.

(10) Patent No.: US 12,356,678 B2
(45) Date of Patent: Jul. 8, 2025

(54) TRENCH-GATE TRANSISTOR DEVICE

(71) Applicant: Leadpower-semi CO., LTD., Zhubei (TW)

(72) Inventors: Po-Hsien Li, Taipei (TW); Wan-Wen Tseng, Hsinchu (TW); Cheng-Jyun Wang, Taoyuan (TW)

(73) Assignee: LEADPOWER-SEMI CO., LTD., Zhubei (TW)

( * ) Notice: Subject to any disclaimer, the term of this patent is extended or adjusted under 35 U.S.C. 154(b) by 469 days.

(21) Appl. No.: 17/891,904

(22) Filed: Aug. 19, 2022

(65) Prior Publication Data
US 2023/0290815 A1 Sep. 14, 2023

(30) Foreign Application Priority Data

Mar. 11, 2022 (TW) .................................. 111108970

(51) Int. Cl.
| | | |
|---|---|---|
| *H10D 62/10* | (2025.01) | |
| *H10D 30/66* | (2025.01) | |
| *H10D 64/27* | (2025.01) | |

(52) U.S. Cl.
CPC ......... *H10D 62/111* (2025.01); *H10D 30/668* (2025.01); *H10D 64/513* (2025.01)

(58) Field of Classification Search
CPC .. H10D 62/111; H10D 62/138; H10D 62/142; H10D 30/668; H10D 30/0245; H10D 30/803; H10D 30/0512; H10D 64/513; H10D 44/466; H10D 84/852; H10D 62/127; H10D 62/8325; H10D 62/107; H10D 62/60; H10D 30/665; H10D 64/51; H10D 64/2563; H10D 12/031; H10D 84/146; A61K 40/422; A61K 40/4246; H10F 39/811

See application file for complete search history.

(56) References Cited

U.S. PATENT DOCUMENTS

| | | | | |
|---|---|---|---|---|
| 2010/0096692 A1* | 4/2010 | Saito | ................... | H01L 29/7813 257/330 |
| 2014/0264563 A1* | 9/2014 | Cheng | ................ | H10D 62/8325 438/270 |
| 2021/0242307 A1* | 8/2021 | Sundaresan | ......... | H01L 29/8083 |

FOREIGN PATENT DOCUMENTS

TW 202027269 A 7/2020

OTHER PUBLICATIONS

F. Udrea, G. Deboy and T. Fujihira, "Superjunction Power Devices, History, Development, and Future Prospects," in IEEE Transactions on Electron Devices, vol. 64, No. 3, pp. 713-727, Mar. 2017, doi: 10.1109/TED.2017.2658344 (Year: 2017).*

(Continued)

*Primary Examiner* — Sitaramarao S Yechuri
(74) *Attorney, Agent, or Firm* — Muncy, Geissler, Olds & Lowe, P.C.

(57) ABSTRACT

A trench-gate transistor device includes a substrate and a transistor structure. The transistor structure includes a plurality of superjunctions arranged in a first direction, a rectifying area that has at least one Schottky-based diode, and at least one active unit that is located at a side of said rectifying area in a second direction that intersects with the first direction.

11 Claims, 10 Drawing Sheets

(56) References Cited

OTHER PUBLICATIONS

R. K. Williams, M. N. Darwish, R. A. Blanchard, R. Siemieniec, P. Rutter and Y. Kawaguchi, "The Trench Power MOSFET—Part II: Application Specific VDMOS, LDMOS, Packaging, and Reliability," in IEEE Transactions on Electron Devices, vol. 64, No. 3, pp. 692-712, Mar. 2017, doi: 10.1109/TED.2017.2655149 (Year: 2017).*
A Search Report appended to an Office Action, which was issued to Taiwanese counterpart application No. 111108970 by the TIPO on Feb. 8, 2023, with an English translation thereof.

* cited by examiner

TRENCH-GATE TRANSISTOR DEVICE

CROSS-REFERENCE TO RELATED APPLICATION

This application claims priority of Taiwanese Invention Patent Application No. 111108970, filed on Mar. 11, 2022.

FIELD

The disclosure relates to a semiconductor device, and more particularly to a trench-gate transistor device.

BACKGROUND

New applications of power semiconductor devices require that the power semiconductor devices operate under high power and high frequency conditions and have high heat resistance and low power consumption; however, conventional silicon-based power devices can no longer support these needs. As a result, silicon carbide (SiC) power devices are developed and have been adopted for various uses because of their wide band gap, higher electron mobility, higher heat conductivity and lower on-state resistance. Particularly, SiC-based trench-gate power metal-on-semiconductor field effect transistor (MOSFET), which is capable of reducing on-state resistance and enhancing edge termination, has become the mainstream in the high-power devices. However, the quality of native oxide in a SiC substrate is difficult to control. Furthermore, defects may exist in the SiC substrate and in turn cause greater channel resistance.

In the example of a vertical-type trench-gate MOSFET having an n-channel, a higher breakdown voltage and a lower on-state resistance may be achieved by increasing the length of the trench gate or reducing the doping concentration of the n-type drift region in the MOSFET. Alternatively, enhancement of the breakdown voltage and lowering of the on-state resistance may be achieved by forming a P/N superjunction structure that replaces the n-type drift region, with p-type and n-type columns having higher doping concentrations. In such trench-gate MOSFET, in order to improve the channel resistance and achieve different breakdown voltages, it is desirable to adjust the pitch between the p-type and n-type columns and the density of the trenches. However, the trench density may still be limited by the p-type columns since the P/N superjunction structure is pre-arranged in the same direction as the channel of the MOSFET, and therefore cannot be adjusted arbitrarily.

SUMMARY

Therefore, an object of the disclosure is to provide a trench-gate transistor device that can alleviate at least one of the drawbacks of the prior art.

According to the disclosure, the trench-gate transistor device includes a substrate and a transistor structure. The transistor includes a plurality of superjunctions arranged in a first direction, a rectifying area that has at least one Schottky-based diode, and at least one active unit that is located at a side of the rectifying area in a second direction that intersects with the first direction.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
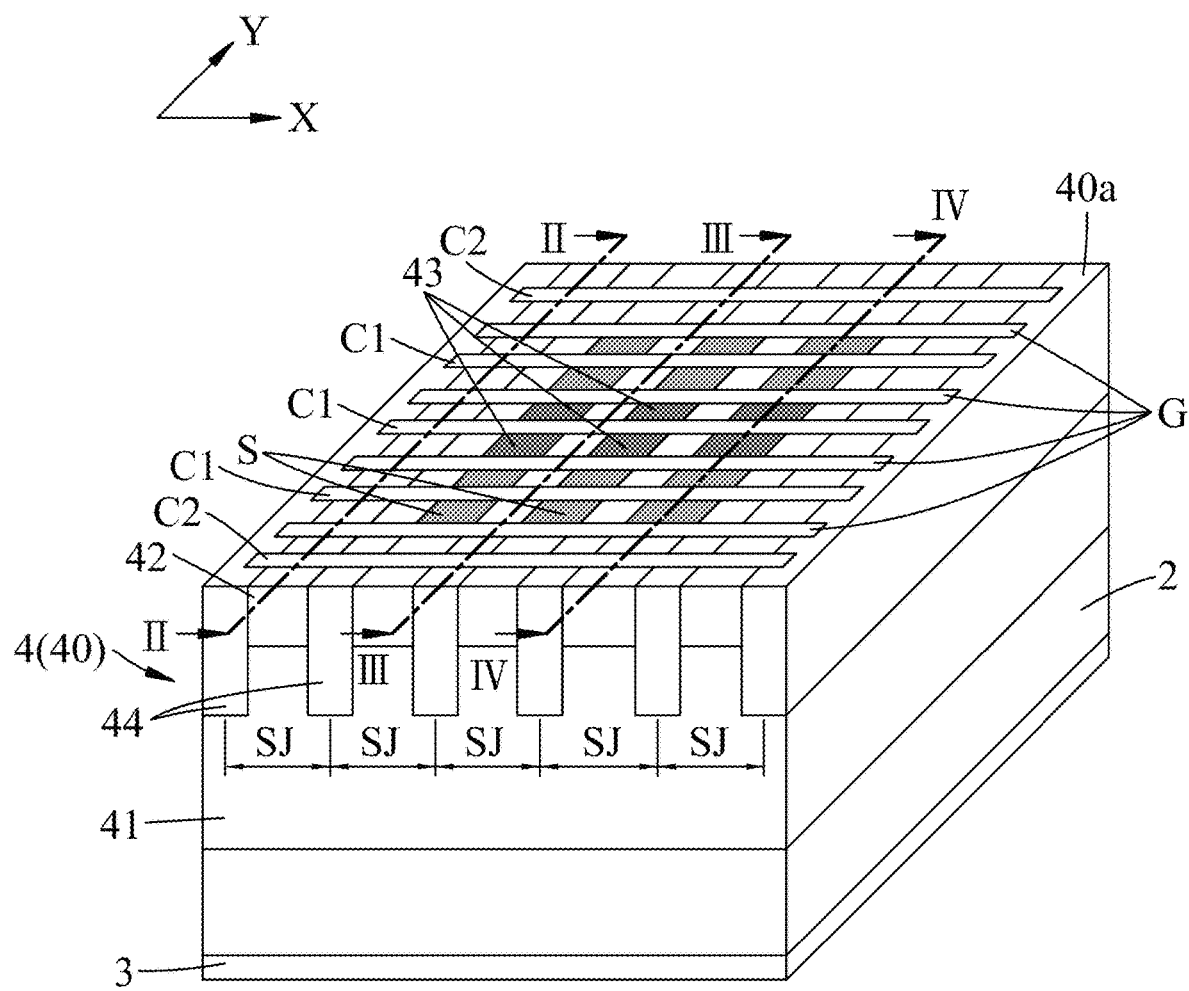
FIG. 1 is a schematic perspective view illustrating an embodiment of a trench-gate transistor device according to the disclosure.
Figure 2:
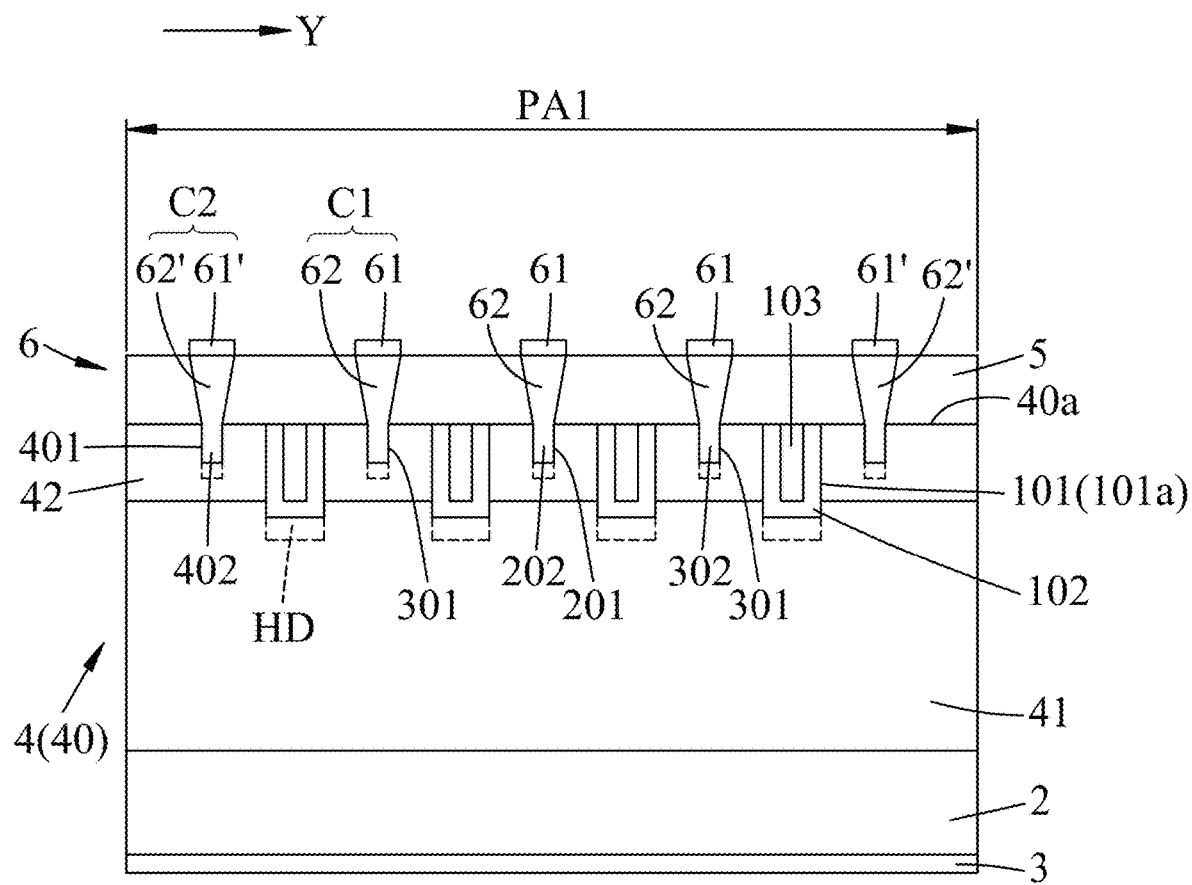
FIG. 2 is a cross-sectional view taken along line II-II of FIG. 1, and illustrates a dielectric layer and a conductive unit formed on a structure shown in FIG. 1.
Figure 3:
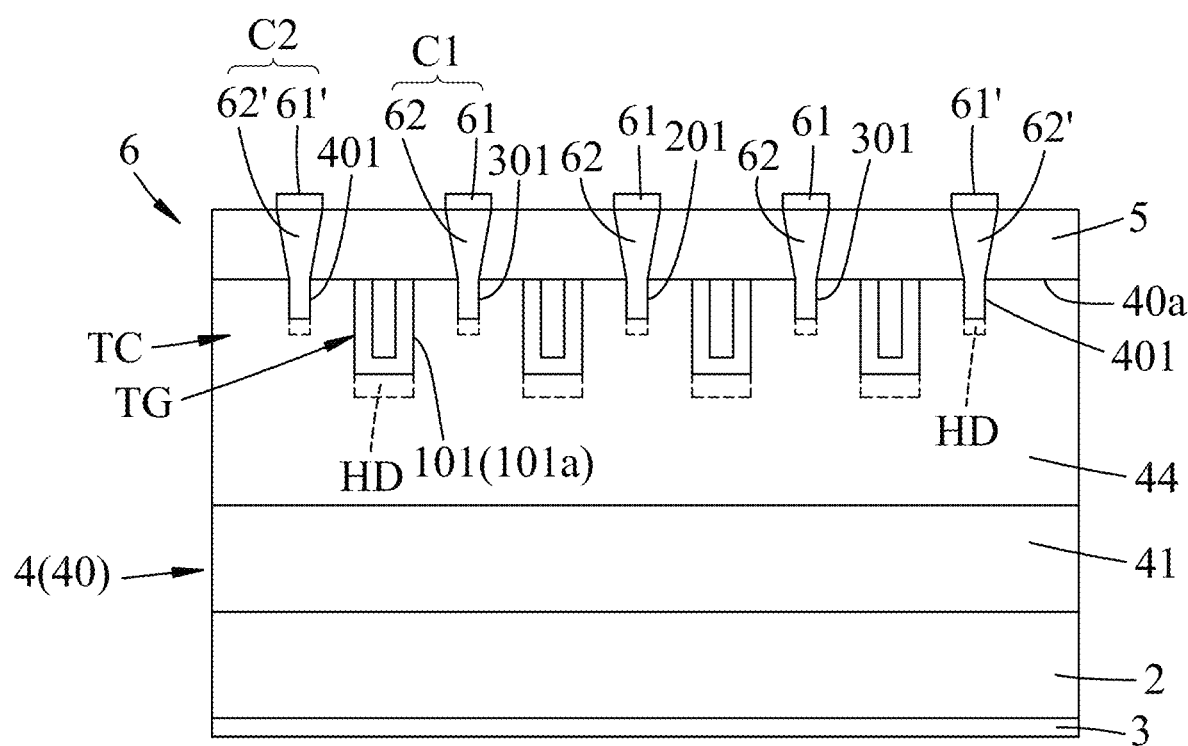
FIG. 3 is a cross-sectional view taken along line III-III of FIG. 1, and illustrates the dielectric layer and the conductive unit formed on the structure shown in FIG. 1.
Figure 4:
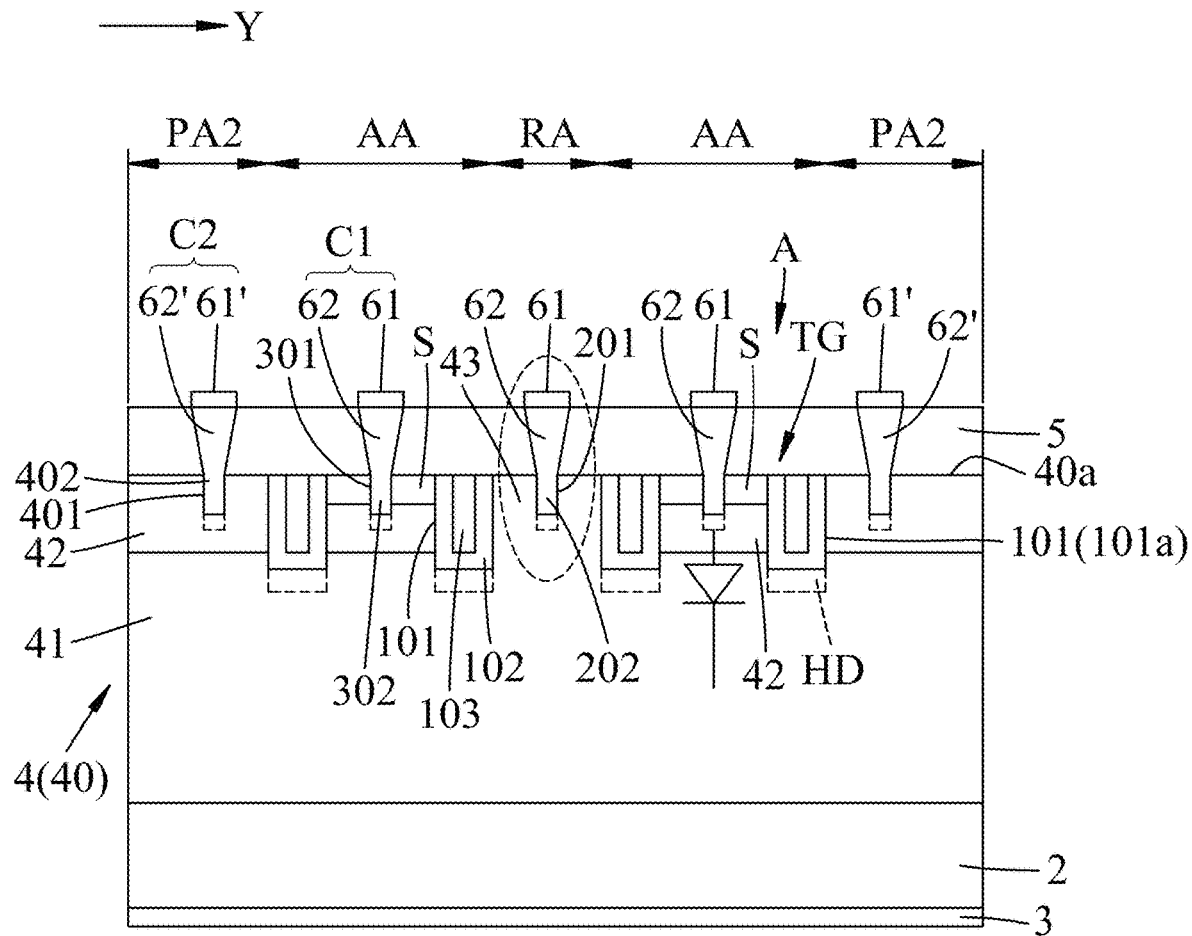
FIG. 4 is a cross-sectional view taken along line IV-IV of FIG. 1, and illustrates the dielectric layer and the conductive unit formed on the structure shown in FIG. 1.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 1 to 4, an embodiment of a trench-gate transistor device according to this disclosure includes a substrate 2, a drain electrode 3, a transistor structure 4, a dielectric layer 5 and a conductive unit 6. The substrate 2 is made of silicon carbide of a first doping type, and has a high doping concentration. The transistor structure 4 is formed on the substrate 2, and the drain electrode 3 is disposed on the substrate 2 opposite to the transistor structure 4 and forms an ohmic contact with the substrate 2.

The transistor structure 4 includes a plurality of superjunctions (SJ) arranged in a first direction (X), a rectifying area (RA), and at least one active unit (A) that is located at a side of the rectifying area (RA) in a second direction (Y) which intersects with the first direction (X). In this embodiment, the transistor structure 4 includes a plurality of the active units (A) that are disposed at two opposite sides of the rectifying area (RA) in the second direction (Y).

To be specific, the transistor structure 4 further includes an epitaxial body 40 made of silicon carbide and having a first doped region 41 of the first doping type, a well region 42 of a second doping type, a second doped region 43 of the first doping type, and a plurality of third doped regions 44 of the second doping type. The well region 42 is disposed above and adjoins the first doped region 41. The second doped region 43 is separated from the well region 42, and is disposed above and adjoins the first doped region 41. The third doped regions 44 are separately arranged in the first direction (X), and are disposed above and adjoin the first doped region 41. Each of the third doped regions 44 extends in the second direction (Y) and is in a strip form. The first doped region 41 has a doping concentration lower than that of the substrate 2 and the same as that of the second doped region 43. The well region 42 has a doping concentration greater than that of each of the third doped regions 44.

The first doping type is one of a p type and an n type, and the second doping type is the other one of the p type and the n type. For example, if the first doping type is the n type, then the second doping type is the p type, and vice versa. The trench-gate transistor device may be an NMOS or a PMOS. In this embodiment, the first doping type is the n type and the second doping type is the p type, so that the substrate 2, the first doped region 41 and the second region 43 are made of n-type SiC, while the well region 42 and the third doped regions 44 are made of p-type SiC. It should be noted that the doping type is not limited thereto.

The rectifying area (RA) includes the second doped region 43 and has at least one Schottky-based diode. Two active areas (AA) are respectively disposed at two opposite sides of the rectifying area (RA) in the second direction (Y), and each of the active units (A) is disposed in a corresponding one of the active areas (AA). The transistor structure 4 further includes a first peripheral area (PA1) which extends in the second direction (Y), and a second peripheral area (PA2) which is connected to the first peripheral area (PA1), and extends in the first direction (X). The first peripheral area (PA1) and the second peripheral area (PA2) cooperatively surround the rectifying area (RA) and the active units (A). The third doped regions 44 and the first doped region 41 cooperatively form the superjunctions (SJ) that are arranged in the first direction (X) intersected by the second direction (Y) in which the active units (A) and the rectifying area (RA) are arranged.

Figure 5:
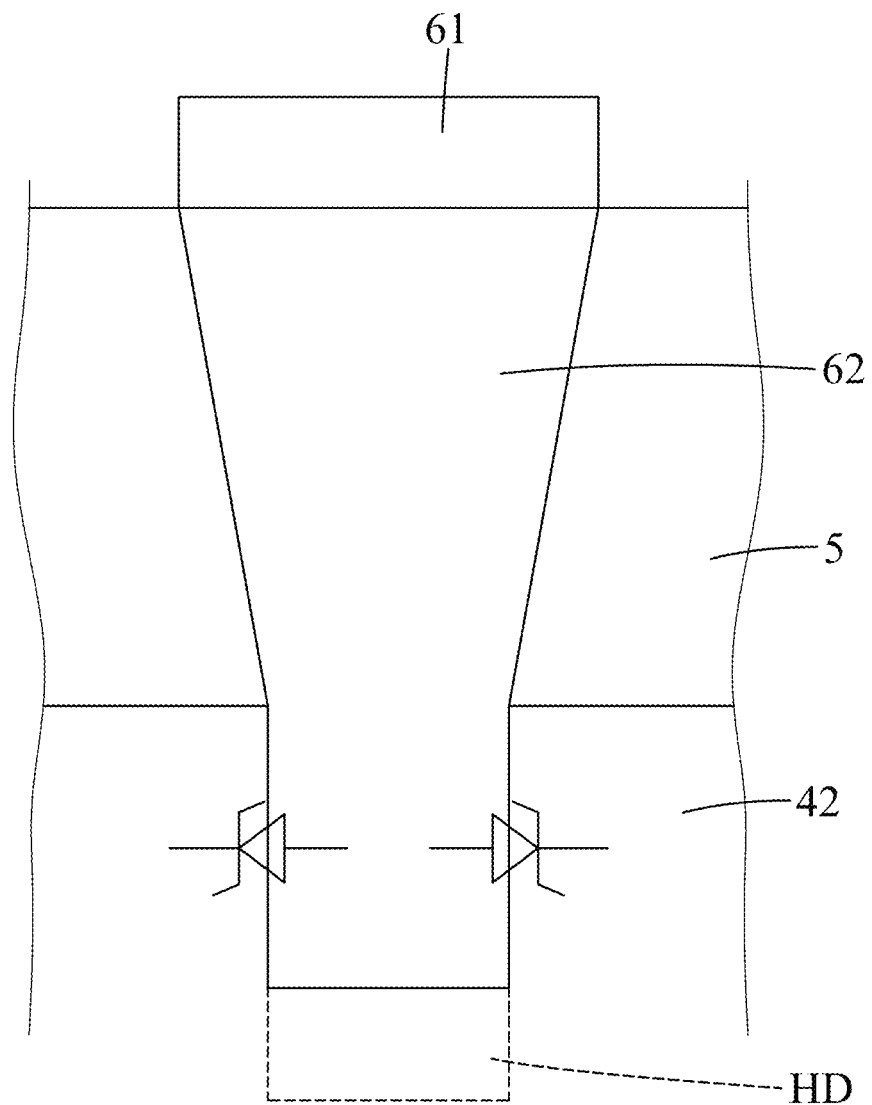
FIG. 5 is an enlarged view illustrating Schottky diodes formed in FIG. 4.

The transistor structure 4 further includes source regions (S) formed in the well region 42, each of which is located at a side of the second doped region 43 in the second direction (Y) and has a depth smaller than that of the well region 42 in the epitaxial body 40. Each of the active units (A) includes a corresponding one of the source regions (S) and a trench gate structure (TG). Each of the source regions (S) has a doping type the same as the first doped region 41 and a doping concentration greater than that of the first doped region 41. The trench gate structure (TG) is extended in the epitaxial body 40 of the transistor structure 4 along the first direction (X), and is disposed adjacent to and adjoins the source region (S) in the second direction (Y). For each of the active units (A), the trench gate structure (TG) is disposed between and adjoins the source region (S) and the rectifying area (RA). In this embodiment, two additional active units (A) are respectively disposed at the active areas (AA), and for each of the additional active units (A), the trench gate structure (TG) is disposed at a side of the source region (S) away from the rectifying area (RA). Therefore, Schottky diodes are formed in the rectifying area (RA), as shown in FIG. 5. In one embodiment, for each of the active units (A), the trench gate structure (TG) is disposed at a side of the source region (S) away from the rectifying area (RA), rather than between and adjoining the source region (S) and the rectifying area (RA). With such configuration, at least one junction barrier Schottky (JBS) diode is formed in the rectifying area (RA).

For each of the active units (A), the trench gate structure (TG) includes a gate trench 101, an insulating layer 102 and a gate electrode 103. The gate trench 101 is recessed from a surface (40a) of the epitaxial body 40 of the transistor structure 4 into the first doped region 41, and has a depth greater than that of the well region 42 in the epitaxial body 40. The insulating layer 102 is formed on a trench-defining wall (101a) that defines the gate trench 101. The insulating layer 102 may be made of a material selected from nitride, oxide or oxynitride, such as silicon nitride, silicon oxide or silicon oxynitride. The gate electrode 103 fills the gate trench 101 to cover the insulating layer 102, and is isolated from the well region 42 and the source region (S) by the insulating layer 102. The gate electrode 103 may be made of polysilicon. In one embodiment, the insulating layer 102 has a bottom portion below the gate electrode 103 that has a thickness greater than or equal to 1000 Å, so that the breakdown caused by charge accumulation may be avoided, thereby improving high voltage endurance of the trench-gate transistor device.

The transistor structure 4 further includes a trench-contact electrode structure (TC) and a plurality of heavily-doped regions (HD).

The trench-contact electrode structure (TC) includes a first trench 201, a first metal layer 202, a plurality of second trenches 301, a plurality of second metal layers 302, a plurality of third trenches 401 and a plurality of third metal layers 402.

The first trench 201 is formed in the epitaxial body 40 of the transistor structure 4 from the surface (40a) and in the rectifying area (RA), extends along the first direction (X), and has a depth smaller than that of the well region 42. The second trenches 301 are formed in the epitaxial body 40 from the surface (40a) and in the source regions (S) of the active units (A). Each of the second trenches 301 extends along the first direction (X), and has a depth smaller than that of the well region 42 in the epitaxial body 40. The first trench 201 and the second trenches 301 are extended to the first peripheral area (PA1). The third trenches 401 are formed in the epitaxial body 40 from the surface (40a) and into the well region 42. Each of the third trenches 401 extends along the first direction (X) in the second peripheral area (PA2) and extends into the first peripheral area (PA1).

The first metal layer 202 fills the first trench 201 and adjoins the second doped region 43 to form a Schottky contact therebetween. The second metal layers 302 respectively fill the second trenches 301 to form ohmic contacts with the source regions (S) for external electrical connection. The third metal layers 402 respectively fill the third trenches 401 to form ohmic contacts with the well region 42.

Each of the heavily-doped regions (HD) is of the second doping type (i.e., p type) and is positioned in the epitaxial body 40 of the transistor structure 4 and under a corresponding one of the gate trench 101 of the trench gate structure (TG) and the first trench 201, the second trenches 301 and the third trenches 401 of the trench-contact electrode structure (TC).

The dielectric layer 5 covers the transistor structure 4 and is made of an insulating material having a low dielectric constant, such as phosphosilicate glass (PSG) or borophosphosilicate glass (BPSG).

The conductive unit 6 is disposed on the dielectric layer 5, and includes a plurality of first contact electrode parts (C1), a plurality of second contact electrode parts (C2) and a plurality of gate connecting parts (G). Each of the first contact electrode parts (C1) is electrically connected to a corresponding one of the first metal layer 202 and the second metal layers 302 and extends along the first direction (X). Each of the second contact electrode parts (C2) is electrically connected to a corresponding one of the third metal layers 402. Each of the gate connecting parts (G) is electrically connected to the gate electrode 103 of a corresponding one of the active units (A). The gate connection parts (G) are spaced apart from each other along the second direction (Y).

Each of the first contact electrode parts (C1) has a conductive line 61 that extends along the first direction (X), and a conductive plug 62 that extends through the dielectric layer 5 and that is connected between the conductive line 61 and the corresponding one of the first metal layer 202 and the second metal layers 302. Each of the contact electrode parts (C2) has a conductive line 61' that extends along the first direction (X), and a conductive plug 62' that extends through the dielectric layer 5 and that is connected between the conductive line 61' and the corresponding one of the third metal layers 402. Each of the gate connection parts (G) has a conductive line (not shown) that extends along the first direction (X), and a conductive plug (not shown) that extends through the dielectric layer 5 and that is connected between the conductive line and the corresponding one of the gate electrodes 103. The gate connecting parts (G) and the first contact electrode parts (C1) are arranged in an alternate manner along the second direction (Y) such that the external electrical connection of the trench-gate transistor device may be achieved using the conductive unit 6.

As shown in FIGS. 6 to 15, an embodiment of a method for manufacturing the trench-gate transistor device is illustrated.

Figure 6:
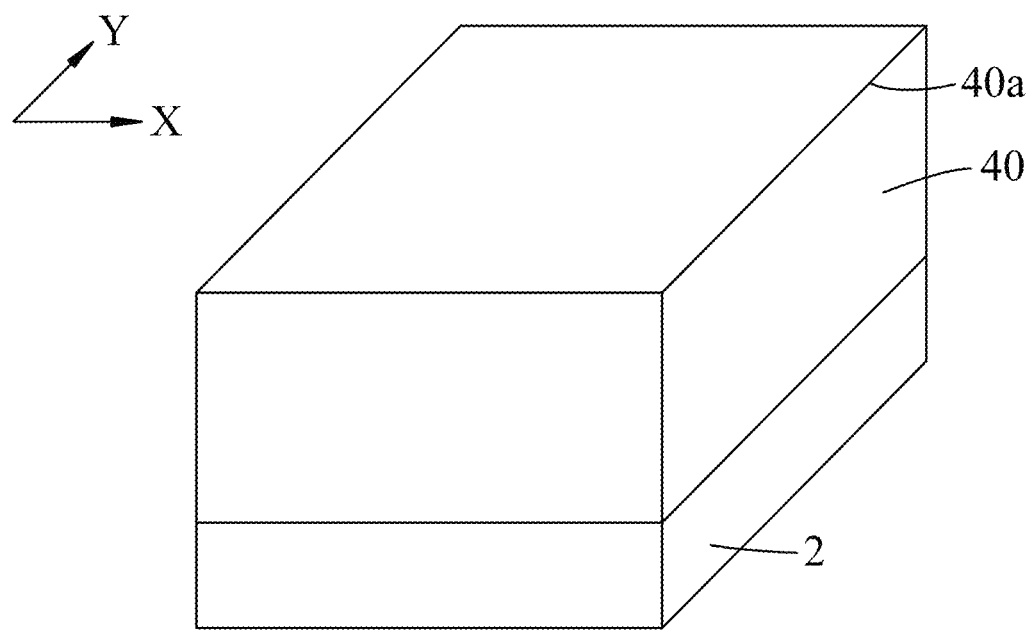
FIGS. 6 to 15 are schematic views illustrating consecutive steps of an embodiment of a method for manufacturing the trench-gate transistor device of FIG. 1 according to the disclosure.

Referring to FIG. 6, a semiconductor structure is formed to include the heavily-doped n-type SiC substrate 2, and the n-type SiC epitaxial body 40 that is formed on the substrate 2 and that has the surface (40a) opposite to the substrate 2. The epitaxial body 40 has a thickness ranging from 5 μm to 100 μm and a doping concentration lower than that of the substrate 1.

Figure 7:
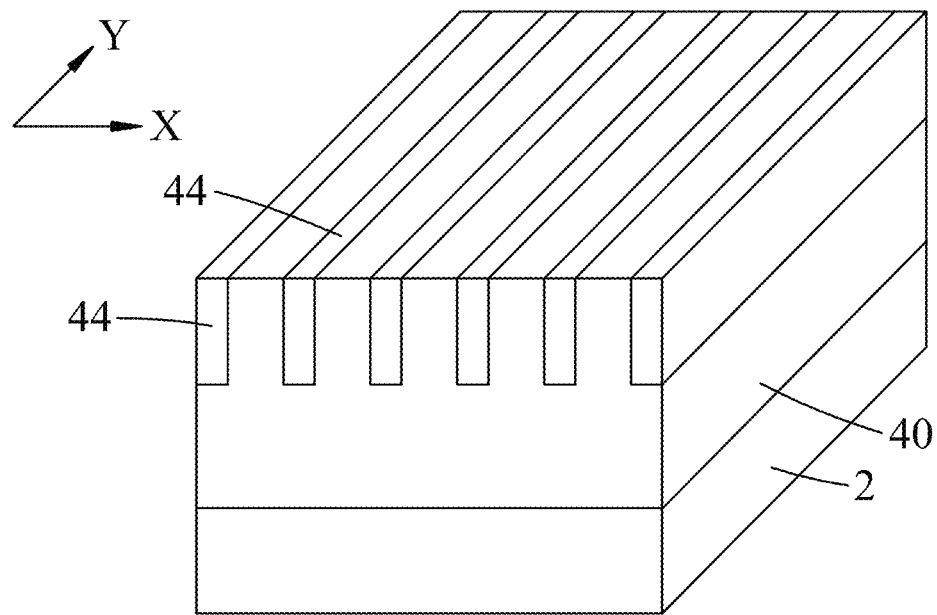

Next, as shown in FIG. 7, a first patterned mask is disposed above the surface (40a) of the epitaxial body 40, and an ion implanting process is conducted from the surface (40a) of the epitaxial body 40 to form the p-type third doped regions 44 in the epitaxial body 40 which are extended in the second direction (Y) and are separately arranged in the first direction (X). Each of the third doped regions 44 has a depth starting from the surface (40a) and ranging from 2 μm to 50 μm.

Figure 8:
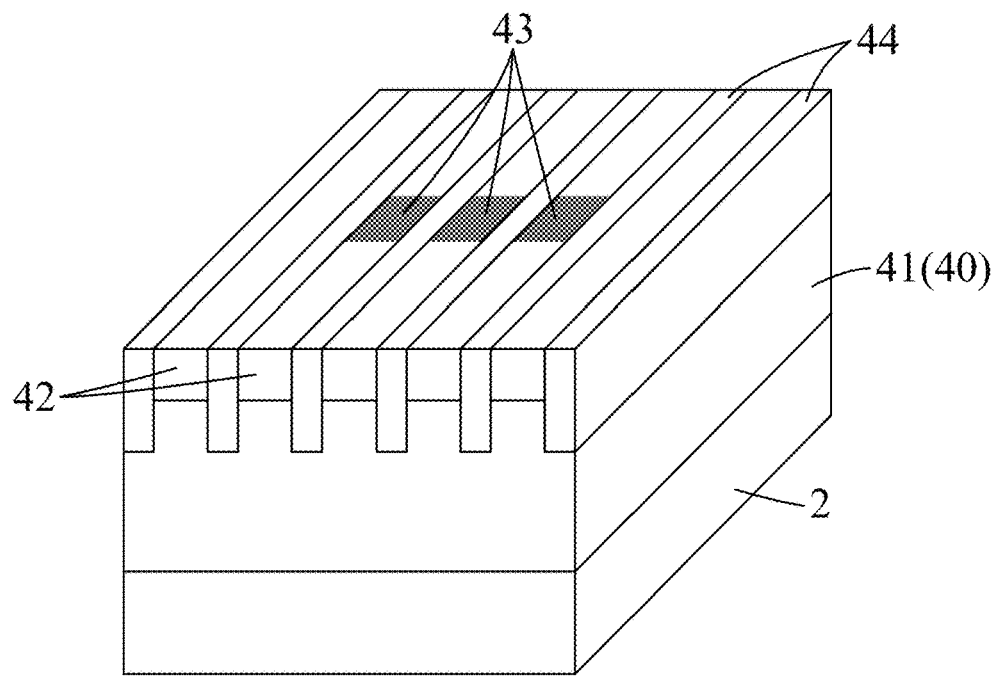

Next, as shown in FIG. 8, a second patterned mask is disposed above the surface (40a) of the epitaxial body 40 to cover the third doped regions 44 and a portion of the epitaxial body 40 between the third doped regions 44, and an ion implanting process is conducted from the surface (40a) of the epitaxial body 40. Thus, the p-type well region 42 is formed from a portion of the epitaxial body 40 that is located between the third doped regions 44 and that is not covered by the second patterned mask, extends in the second direction (Y), and has a depth starting from the surface (40a) of the epitaxial body 40 and ranging from 0.2 μm to 3 μm. A portion of the epitaxial body 40 which is located under the third doped regions 44 and the well region 42 forms the first doped region 41. The portion of the epitaxial body 40, which is located between the third doped regions 44 and is covered by the second patterned mask (i.e., not ion-implanted), forms the second doped region 43. The second doped region 43 extends from the surface (40a) into the epitaxial body 40 and adjoins the first doped region 41.

Figure 9:
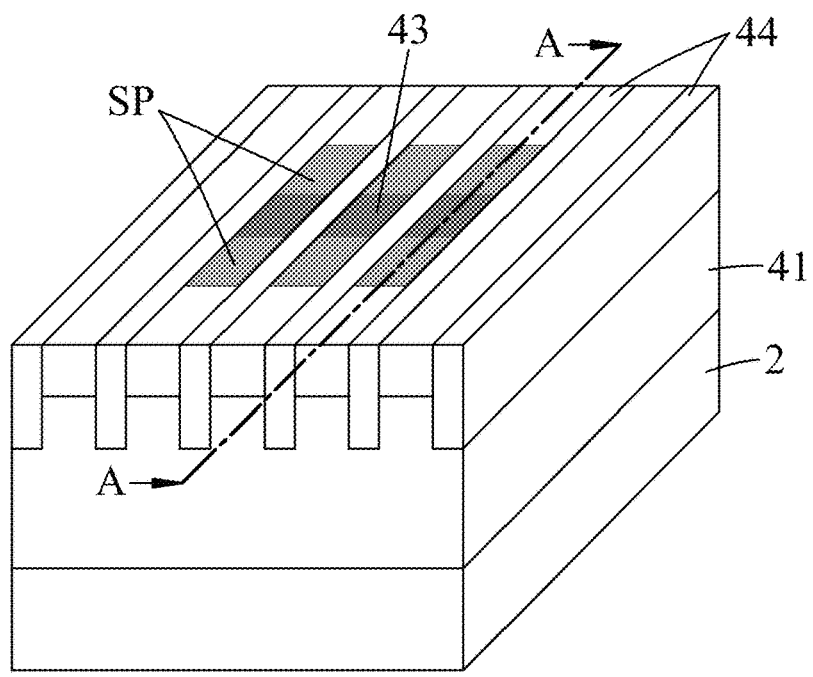

Next, as shown in FIG. 9, a third patterned mask is applied, and an ion implanting process is conducted from the surface (40a) of the epitaxial body 40 to form n-type source parts (SP) at opposite sides of the second doped region 43 in the second direction (Y). Each of the source parts (SP) extends from the surface (40a) into the well region 42 and has a depth smaller than that of the well region 42 (e.g., ranging from 0.05 μm to 1 μm).

Figure 10:
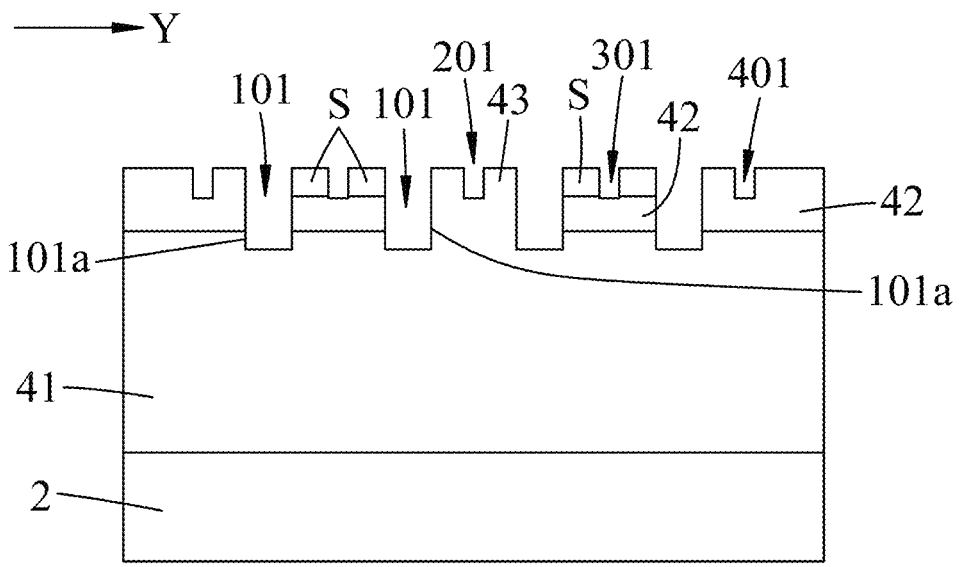

Next, referring to FIG. 10, which is taken along line A-A of FIG. 9, the gate trenches 101, the first trench 201, the second trenches 301 and the third trenches 401 are formed in the semiconductor structure from FIG. 8 by etching. The abovementioned trenches are recessed from the surface (40a) into the epitaxial body 40 and all extend in the first direction (X). In certain embodiments, the gate trenches 101, the first trench 201, the second trenches 301 and the third trenches 401 are separately and parallelly arranged in the second direction (Y). The gate trenches 101 are formed adjacent to the source parts (SP) and are recessed into the first doped region 41 and the third doped regions 44, so that each of the gate trenches 101 has a depth greater than that of the well region 42 in the epitaxial body 40. The first trench 201 is recessed into the second doped region 43 and the third doped regions 44, and has a depth smaller than that of the well region 42. Each of the second trenches 301 is recessed into the third dope regions 44 and through a corresponding one of the source parts (SP) into the well region 42, and has a depth smaller than that of the well region 42. Each of the source parts (SP) is divided into two source regions (S) separated by a respective one of the second trenches 301. Each of the third trenches 401 is recessed into the well region 42 and the third doped regions 44, and has a depth smaller than that of the well region 42 in the epitaxial body 40. Each of the gate trenches 101 has a width in the second direction (Y) greater than that of each of the first trench 201, the second trenches 301 and the third trenches 401.

Figure 11:
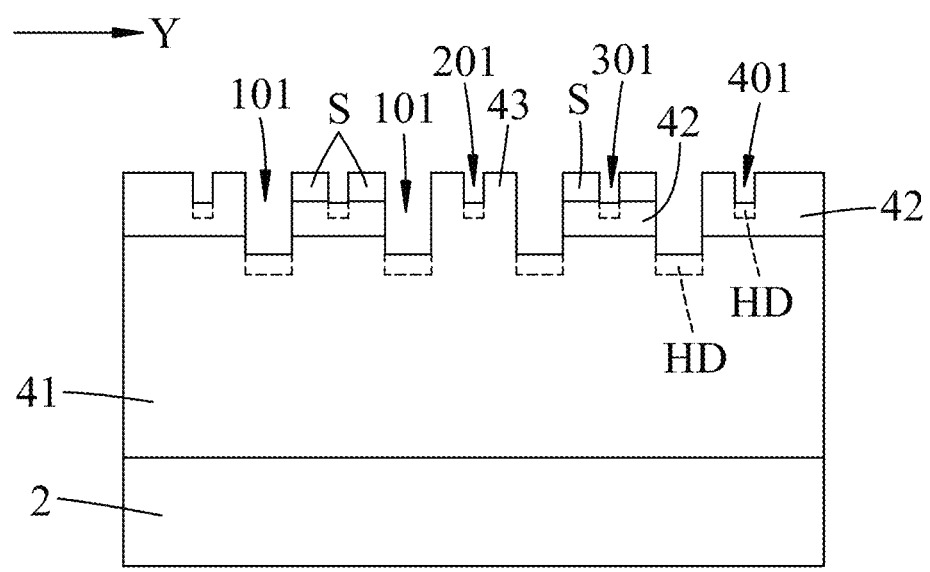

Next, referring to FIG. 11, ion implanting and annealing processes are conducted to form the heavily-doped regions (HD) in the epitaxial body 40. To be specific, the portions of the epitaxial body 40 located under the gate trenches 101, the first trench 201, the second trenches 301 and the third trenches 401 are doped by the ion implanting process and then subjected to the annealing process to form the p-type heavily-doped regions (HD). Each of the heavily-doped regions (HD) has a doping concentration greater than that of the well region 42.

Figure 12:
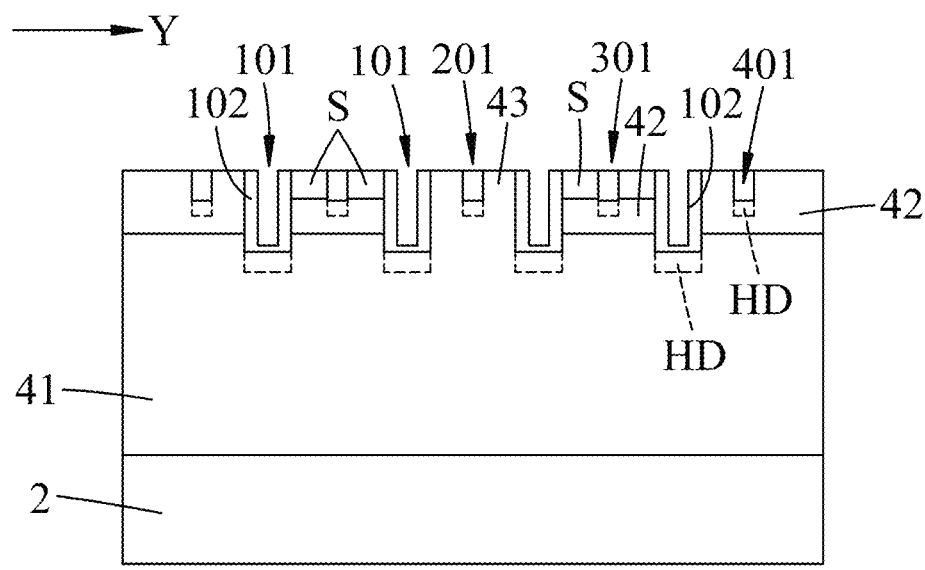

Next, referring to FIG. 12, an insulating material is formed on the trench-defining wall (101a) that defines a corresponding one of the gate trenches 101 and also fills the first trench 201, the second trenches 301 and the third trenches 401 by deposition. Then, the insulating material is annealed to form an insulating layer 102. The insulating material may be a high-k dielectric material commonly used in semiconductor, e.g., silicon nitride ($Si_3N_4$), silicon dioxide ($SiO_2$) or silicon oxynitride ($SiON_x$).

It should be noted that the depth of the gate trenches 101 and the thickness of the insulating layer 102 may be adjusted depending on the desired features and performance of the power devices. Since selection of the insulating material, the depth of the gate trench 101 and the thickness of the insulating layer 102 that may relate to the performance of the power devices have been well known to a skilled artisan, related descriptions are omitted for brevity.

Figure 13:
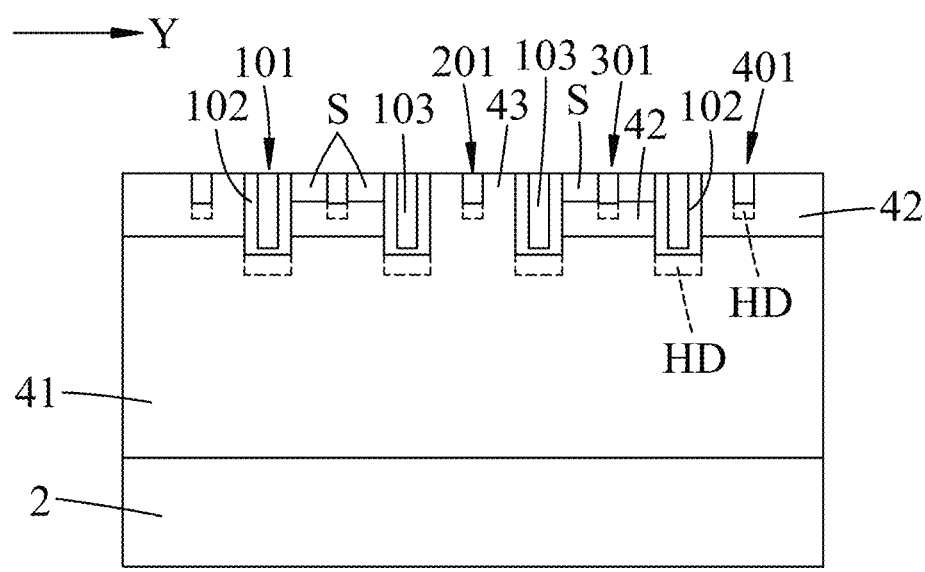

Next, referring to FIG. 13, each of the gate trenches 101 is filled with polysilicon to cover the insulating layer 102 to form the gate electrode 103.

Figure 14:
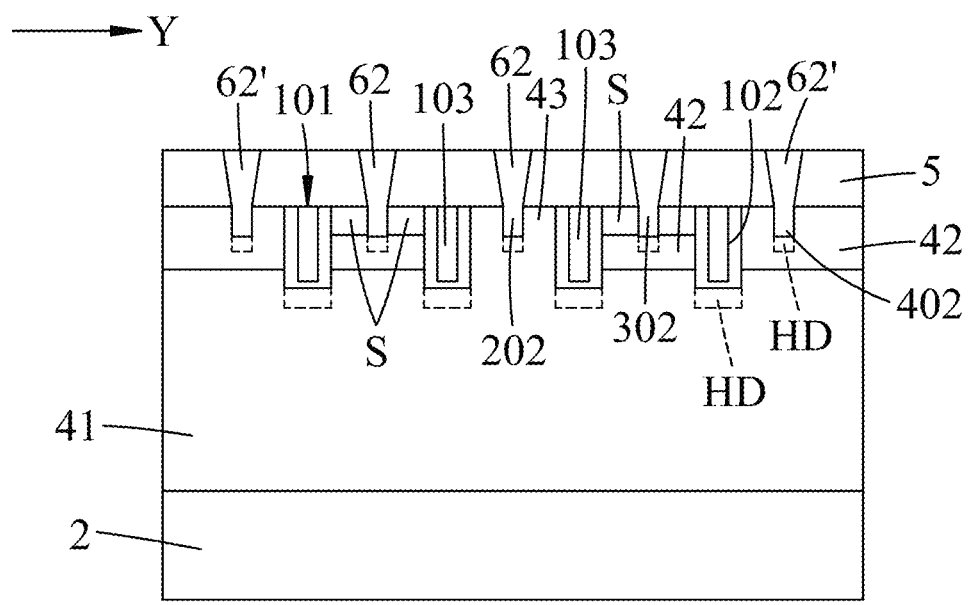

Next, referring to FIG. 14, the dielectric layer 5 is formed on the semiconductor structure from FIG. 13, i.e., formed on the epitaxial body 40, and is etched to form a plurality of vias that are registered with and that are in communication with the first trench 201, the second trenches 301 and the third trenches 401, where the insulating material filled therein has been removed. The dielectric layer 5 also has vias that are registered with the gate trenches 101 (not shown in FIG. 14). Metal materials are deposited in the vias, the first trench 201, the second trenches 301 and the third trenches 401. Thus, a first metal layer 202 is formed in the first trench 201, a plurality of second metal layers 302 are formed in the second trenches 301, a plurality of third metal layers 402 are formed in the third trenches 401, and a plurality of conductive plugs 62, 62' are formed in the vias of the dielectric layer 5 and are respectively connected to the gate electrodes 103 (the conductive plugs connected to the gate electrodes 103 are not shown in FIG. 14), first metal layer 202, the second metal layers 302 and the third metal layers 402.

Figure 15:
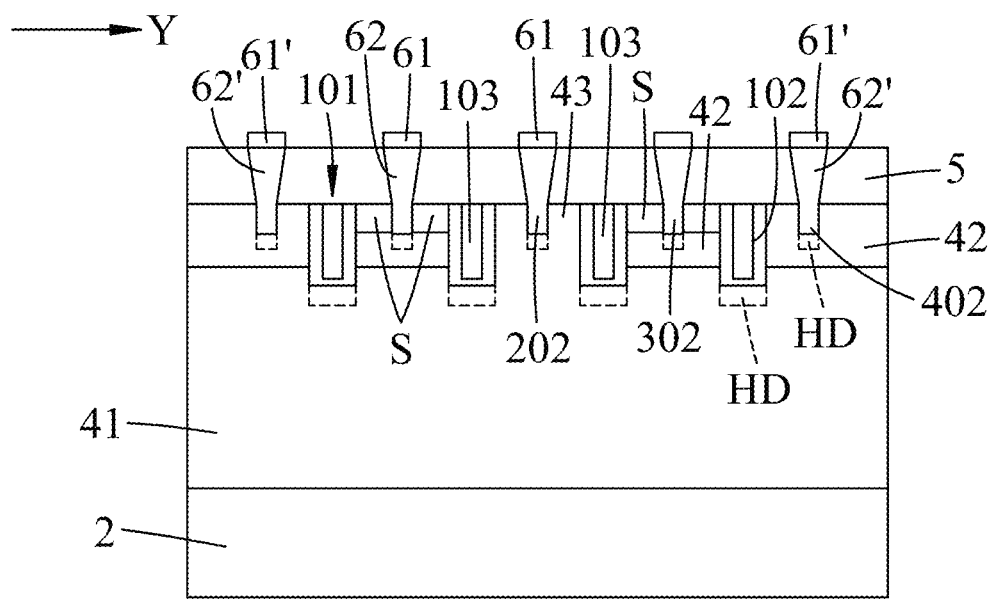

Next, referring to FIG. 15, the conductive lines 61, 61' are formed and respectively connected to the conductive plugs 62, 62' to form first contact electrode parts (C1), second contact electrode parts (C2) and gate connecting parts (G) (see FIG. 1). Lastly, a drain electrode 3 is disposed on the substrate 2 opposite to the epitaxial body 40 to form an ohmic contact with the substrate 2, and the manufacturing of the trench-gate transistor device is thus completed.

To sum up, by arranging the rectifying area (RA) and the active unit (A) in a direction intersecting with a direction in which the superjunctions (SJ) are arranged, adjustment of widths of the superjunctions (SJ) and adjustment of channel width of the active unit (A) may become independent from one another, which leads to greater flexibility in adjustment of the device structure. On the other hand, the heavily-doped regions (HD) positioned under the gate trenches 101 are closer to the superjunctions (SJ) formed between the first doped region 41 and the third doped regions 44 such that a fringing field at a bottom edge of the gate trenches 101 and a gate-to-drain capacitance ($C_{gd}$) may be reduced. Furthermore, these heavily-doped regions (HD) may withstand higher breakdown voltage to protect the bottom portions of the insulating layers 102 (e.g., oxide insulating material), and thereby avoid the reliability issue of the trench gate structure (TG), which may be triggered by the electric field at the bottom edge of the gate trenches 101. In addition, by incorporating Schottky-based diodes into the trench-gate transistor device, power consumed during forward and reverse recovery time by the trench-gate transistor device may be reduced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A trench-gate transistor device, comprising:
   a substrate made of silicon carbide of a first doping type; and
   a transistor structure including:
      a plurality of superjunctions arranged in a first direction;
      a rectifying area that has at least one Schottky-based diode;
      at least one active unit that is located at a side of said rectifying area in a second direction that intersects with the first direction; and
      an epitaxial body made of silicon carbide and having:
         a first doped region of the first doping type having a doping concentration lower than that of said substrate;
         a well region of a second doping type disposed above and adjoining said first doped region;
         a second doped region of the first doping type separating from said well region and disposed above and adjoining said first doped region;
         a plurality of third doped regions of the second doping type separately arranged in the first direction, and disposed above and adjoining said first doped region so as to form said plurality of superjunctions therebetween, each of said third doped regions extending in the second direction; and
         a source region formed in said well region and located at a side of said second doped region in the second direction, said at least one active unit including said source region,
   wherein said first doped region and said second doped region have the same doping concentrations, and said well region has a doping concentration greater than that of each of said third doped regions,
   wherein said rectifying area includes said second doped region,
   wherein said at least one active unit further includes a trench gate structure which is extended in said epitaxial body along the first direction and is disposed adjacent to and adjoins said source region in the second direction,
   wherein said transistor structure includes a plurality of said active units that are disposed at two opposite sides of said rectifying area in the second direction,
   wherein, for each of said active units, said trench gate structure includes:
      a gate trench which is extended from a surface of said epitaxial body into said first doped region, and which has a depth greater than that of said well region in said epitaxial body;
      an insulating layer formed on a trench-defining wall that defines said gate trench; and
      a gate electrode which fills said gate trench to cover said insulating layer, and which is isolated from said well region and said source region by said insulating layer;
   wherein said trench-gate transistor device further includes:
      a dielectric layer which covers said transistor structure; and
      a conductive unit which is disposed on said dielectric layer and includes a plurality of gate connecting parts, each of which is electrically connected to said gate electrode of a corresponding one of said active units,
   wherein said gate connection parts are spaced apart from each other along the second direction,
   wherein said transistor structure further includes a trench-contact electrode structure, said trench-contact electrode structure including:

a first trench which is formed in said epitaxial body from said surface and in said rectifying area, extends along the first direction, and has a depth smaller than that of said well region;

a first metal layer which fills said first trench and adjoins said second doped region to form a Schottky contact therebetween;

a plurality of second trenches which are formed in said epitaxial body from said surface and in said source regions of said active units, each of which extends along the first direction, and has a depth smaller than that of said well region in said epitaxial body; and a plurality of second metal layers which respectively fills said second trenches to form ohmic contacts with said source regions;

wherein said conductive unit further includes a plurality of first contact electrode parts. each of which is electrically connected to a corresponding one of said first metal layer and said second metal layers and extends along the first direction, wherein said gate connecting parts and said first contact electrode parts are arranged in an alternate manner along the second direction, and wherein said transistor structure further includes a first peripheral area that extends in the second direction, and a second peripheral area that is connected to said first peripheral area and that extends in the first direction, said first peripheral area and said second peripheral area cooperatively surrounding said rectifying area and said active units.

2. The trench-gate transistor device of claim 1, wherein the first doping type is one of a p type and an n type, and the second doping type is the other one of the p type and the n type.

3. The trench-gate transistor device of claim 1, wherein, for each of said active units, said trench gate structure is disposed between and adjoins said source region and said rectifying area.

4. The trench-gate transistor device of claim 1, wherein, for each of said active units, said trench gate structure is disposed at a side of said source region away from said rectifying area.

5. The trench-gate transistor device of claim 1, wherein said insulating layer is made of oxide or nitrogen oxide, and has a bottom portion below said gate electrode, said bottom portion having a thickness greater than or equal to 1000 Å.

6. The trench-gate transistor device of claim 1, wherein each of said first contact electrode parts has a conductive line that extends along the first direction, and a conductive plug that extends through said dielectric layer and that is connected between said conductive line and the corresponding one of said first metal layer and said second metal layers.

7. The trench-gate transistor device of claim 1, wherein said first trench and said second trenches are extended to said first peripheral area.

8. The trench-gate transistor device of claim 1, wherein said trench-contact electrode structure further includes:

a plurality of third trenches which are formed in said epitaxial body from said surface into said well region, each of which extends along the first direction in said second peripheral area and extends into said first peripheral area, and a plurality of third metal layers which respectively fill said third trenches to form ohmic contacts with said well region.

9. The trench-gate transistor device of claim 8, wherein said transistor unit further includes a plurality of heavily-doped regions of the second doping type, each of which is positioned in said epitaxial body and under a corresponding one of said gate trench, said first trench, said second trenches and said third trenches.

10. The trench-gate transistor device of claim 8, wherein:

said conductive unit further includes a plurality of second contact electrode parts, each of which is electrically connected to a corresponding one of said third metal layers; and each of said contact electrode parts has a conductive line that extends along the first direction, and a conductive plug that extends through said dielectric layer and that is connected between said conductive line and the corresponding one of said third metal layers.

11. The trench-gate transistor device of claim 1, further comprising a drain electrode disposed on said substrate opposite to said transistor structure.

\* \* \* \* \*